United States Patent
Ohkura

(10) Patent No.: US 8,772,182 B2
(45) Date of Patent: *Jul. 8, 2014

(54) SEMICONDUCTOR DEVICE HAVING REINFORCED LOW-K INSULATING FILM AND ITS MANUFACTURE METHOD

(75) Inventor: Yoshiyuki Ohkura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 371 days.

This patent is subject to a terminal disclaimer.

(21) Appl. No.: 12/774,302

(22) Filed: May 5, 2010

(65) Prior Publication Data

US 2010/0216303 A1 Aug. 26, 2010

Related U.S. Application Data

(62) Division of application No. 11/451,506, filed on Jun. 13, 2006, now abandoned.

(30) Foreign Application Priority Data

Feb. 24, 2006 (JP) ................................. 2006-048131

(51) Int. Cl.
*H01L 21/00* (2006.01)

(52) U.S. Cl.
USPC 438/795; 257/751; 257/E21.16; 257/E21.241; 257/E21.242; 257/E21.273; 257/E29.255; 438/253; 438/711; 438/778; 438/781; 438/788; 438/790; 438/798

(58) Field of Classification Search
USPC ............. 257/751, E21.16, E21.241, E21.242, 257/E21.273, E21.576, E21.579, E21.581, 257/E29.255; 438/253, 711, 778–781, 438/788–790, 795, 798
See application file for complete search history.

(56) References Cited

U.S. PATENT DOCUMENTS

| | | | | |
|---|---|---|---|---|
| 6,156,671 | A * | 12/2000 | Chang et al. | 438/778 |
| 7,262,142 | B2 * | 8/2007 | Nakata et al. | 438/795 |
| 2003/0089903 | A1 | 5/2003 | Nakata et al. | |
| 2004/0155340 | A1 | 8/2004 | Owada et al. | |

(Continued)

FOREIGN PATENT DOCUMENTS

| | | |
|---|---|---|
| JP | 2002-370059 A | 12/2002 |
| JP | 2004-88047 A | 3/2004 |

(Continued)

OTHER PUBLICATIONS

Japanese Office Action mailed Apr. 20, 2010, issued in corresponding Japanese Patent Application No. 2006-048131.

*Primary Examiner* — Meiya Li

(74) *Attorney, Agent, or Firm* — Westerman, Hattori, Daniels & Adrian, LLP

(57) ABSTRACT

A semiconductor device manufacture method has the steps of:
(a) coating a low dielectric constant low-level insulating film above a semiconductor substrate formed with a plurality of semiconductor elements; (b) processing the low-level insulating film to increase a mechanical strength of the low-level insulating film; (c) coating a low dielectric constant high-level insulating film above the low-level insulating film; and (d) forming a buried wiring including a wiring pattern in the high-level insulating film and a via conductor in the low-level insulating film. The low-level insulating film and high-level insulating film are made from the same material. The process of increasing the mechanical strength includes an ultraviolet ray irradiation process or a hydrogen plasma applying process.

10 Claims, 8 Drawing Sheets

(56) References Cited

U.S. PATENT DOCUMENTS

| | | | |
|---|---|---|---|
| 2004/0227242 A1* | 11/2004 | Noguchi et al. | 257/751 |
| 2005/0090122 A1* | 4/2005 | Jang et al. | 438/795 |
| 2005/0194688 A1 | 9/2005 | Gotkis et al. | |
| 2005/0253271 A1 | 11/2005 | Nakata et al. | |
| 2006/0087041 A1 | 4/2006 | Fukuyama et al. | |
| 2006/0094234 A1 | 5/2006 | Soda et al. | |
| 2006/0192286 A1 | 8/2006 | Kanamura | |

FOREIGN PATENT DOCUMENTS

| | | |
|---|---|---|
| JP | 2004-260076 A | 9/2004 |
| JP | 2005-45176 A | 2/2005 |
| JP | 2005-317835 A | 11/2005 |

* cited by examiner

FIG. 1A

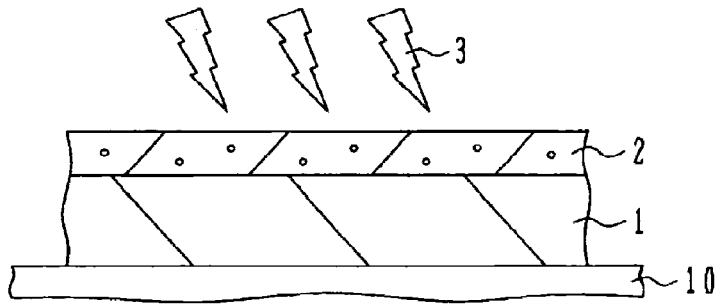

FIG. 1B

| UV PROCESSING | | | |
|---|---|---|---|
| SUBSTRATE TEMPERATURE | WAVELENGTH | POWER | PRESSURE |
| 350℃ | 200~300nm | 220mW/cm² | 1.2Torr |

FIG. 1C

|  | BEFORE UV PROCESSING | AFTER UV PROCESSING |
|---|---|---|
| YOUNG'S MODULUS (GPa) | 10 | 12 |
| HARDNESS | 0.9 | 1.1 |
| RELATIVE DIELECTRIC CONSTANT | 2.2 | 2.3 |

FIG. 1D

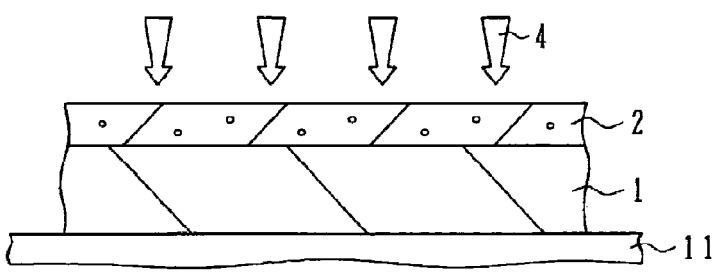

FIG. 1E

| H₂ PLASMA PROCESSING | | | |
|---|---|---|---|
| SUBSTRATE TEMPERATURE | H₂ FLOW RATE | PRESSURE | POWER |
| 400℃ | 4000sccm | 2.3Torr | 100W |

FIG. 1F

|  | BEFORE H₂ PROCESSING | AFTER H₂ PROCESSING |
|---|---|---|
| YOUNG'S MODULUS (GPa) | 10 | 12 |
| HARDNESS | 0.9 | 1.1 |
| RELATIVE DIELECTRIC CONSTANT | 2.2 | 2.3 |

-Si-O-CxHy + HO-Si- → -Si-O-Si- + CxHy-OH↑

SEMICONDUCTOR DEVICE HAVING REINFORCED LOW-K INSULATING FILM AND ITS MANUFACTURE METHOD

CROSS REFERENCE TO RELATED APPLICATION

This application is a division of U.S. application Ser. No. 11/451,506, filed on Jun. 13, 2006, which is based on and claims priority of Japanese Patent Application No. 2006-048131 filed on Feb. 24, 2006, the entire contents of which are incorporated herein by reference.

BACKGROUND OF THE INVENTION

A) Field of the Invention

The present invention relates to a semiconductor device and its manufacture method, and more particularly to a semiconductor device using dielectric having a low dielectric constant (low-k) as an interlayer insulating film.

B) Description of the Related Art

High integration and high speed operation of semiconductor integrated circuit devices lead to finer transistors and finer wirings. An operation speed of a semiconductor device is greatly influenced by a time constant RC (R: resistance, C: parasitic capacitance) of wirings. As wirings are made finer, a wiring pitch becomes narrow and a wiring width is narrowed. As a cross sectional area of a wiring reduces, a resistance R increases.

In order to lower the resistance of a finer wiring, a copper wiring has been used in place of an aluminum wiring. Since a precision of etching a copper wiring is low, a damascene (buried) wiring has been adopted. Wiring trenches and via holes are formed in an insulating film, a copper wiring constituting wiring patterns and via conductors is buried in the trenches and via holes, and unnecessary copper wirings are removed by etch-back or chemical mechanical polishing (CMP).

A wiring height is made high to prevent an increase in resistance while a wiring width is maintained narrow. If insulating films for electrically insulating wirings are made of the same material and if the wiring pitch is narrowed and the wiring height is increased, a parasitic capacitance of wirings increases. An increase in the parasitic capacitance prevents a high speed operation of the semiconductor device. It has been desired to change the material for insulating wirings, from silicon oxide having a relative dielectric constant of about 4.2 to a material having a lower dielectric constant.

One of insulating materials having a low-k is porous silicon oxide (silica) formed from a silicon oxide base material changed to a porous state. Assuming that pores are filled with vacuum or gas, the relative dielectric constant of pores is about 1 and it is expected that the dielectric constant becomes lower as a pore ratio is raised.

As the pore ratio of porous silicon oxide is raised, although the dielectric constant lowers correspondingly, a mechanical strength of the film represented by Young's modulus and hardness lowers. If multi-layer wirings are formed by using interlayer insulating films made of a porous silicon oxide film having a low mechanical strength, interlayer cracks are likely to be formed by thermal and mechanical stresses during forming multi-layer wirings and stresses during package sealing.

Adhesion properties are poor between a porous or non-porous low-k insulating film and an insulating film such as a silicon nitride film to be used for an etching mask or a CMP stopper. In order to improve adhesion properties, it has been proposed to change properties of an underlying film surface before an insulating film is formed. Changing processes disclosed to date include a method of roughing an underlying surface by exposing to argon plasma to increase an anchoring force, or lowering an F concentration of an SiOF film surface, a method of roughing a film surface by applying ultrasonic vibrations, a method of oxidizing a film surface by irradiating ultraviolet rays, and other methods.

SUMMARY OF THE INVENTION

An object of the present invention is to increase a mechanical strength of a low-k film to be used as an interlayer insulating film.

As a pore ratio of a porous insulating film is raised, a mechanical strength lowers as the dielectric constant lowers. Another object of the present invention is to increase a mechanical strength of a porous insulating film.

It is desired to avoid the characteristics (dielectric constant and the like) of an interlayer insulating film from being degraded due to an increase in a mechanical strength, as much as possible.

According to one aspect of the present invention, there is provided a semiconductor device comprising:

a semiconductor substrate having a plurality of semiconductor elements;

a buried wiring formed above the semiconductor substrate and including a via conductor for connection to a conductor in a lower layer and a wiring pattern connected to the via conductor; and an interlayer insulating film surrounding a periphery of the buried wiring and including a low-level insulating film surrounding the via conductor and a high-level insulating film surrounding the wiring pattern, the low-level insulating film and the high-level insulating film being made from a same starting material, and the low-level insulating film having a higher mechanical strength than a mechanical strength of the high-level insulating film.

According to another aspect of the present invention, there is provided a semiconductor device manufacture method comprising the steps of:

(a) coating a low-level insulating film above a semiconductor substrate formed with a plurality of semiconductor elements;

(b) processing the low-level insulating film to increase a mechanical strength;

(c) coating a high-level insulating film above the low-level insulating film; and (d) forming a buried wiring including a wiring pattern in the high-level insulating film and a via conductor in the low-level insulating film.

Since the mechanical strength of the low-level insulating film surrounding the via conductor is increased, the mechanical strength of the whole wiring structure can be improved.

Since an in-plane density of via conductors is lower than an in-plane density of wiring patterns, an influence of an increase in the mechanical strength upon an increase in the dielectric constant can be suppressed.

BRIEF DESCRIPTION OF THE DRAWINGS

FIGS. 1A to 1G are cross sectional views, tables, and chemical reaction formulae illustrating experiments made by the present inventor, experimental results, and expected reactions.

DESCRIPTION OF THE PREFERRED EMBODIMENTS

Figure 2A:
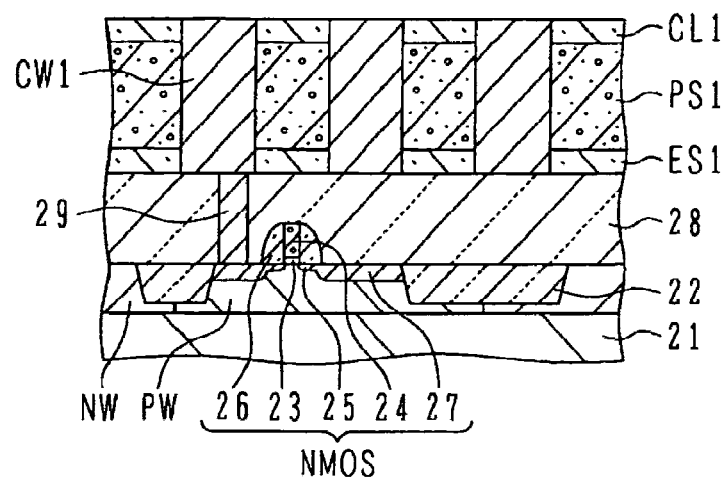
FIGS. 2A to 2E are schematic cross sectional views illustrating the processes of forming interlayer insulating films and copper wirings of a first kind.

The present inventor has evaluated and studied various coating type porous silica materials presently available. A lowest dielectric constant of porous silica is about 2.2, its Young's modulus is about 10 Pa, and its hardness measured by nano-indentation method is about 0.1. It has been found that interlayer cracks are formed if interlayer insulating films made of such porous silica is used for forming a multi-layer wiring structure.

The present inventor has experimentally checked how mechanical strength and the like changes by processing a formed porous silica film.

FIG. 1A is a schematic cross sectional view illustrating technical content of experiment. Porous silica material was spin-coated on a silicon substrate 1 to form a coated film 2. The porous silica material used was the material having a product name of "nano clustering silica" (NCS) and manufactured by Catalysts & Chemicals Ind. Co., Ltd. It is said that this material contains as its composition tetraalkylammonium hydroxide, solvent is removed by baking at 70° C., and cross-linking of SiO bonds are enhanced by baking at 250° C. and 350° C. A spin coater (product name: ACTS) manufactured by Tokyo Electron, Ltd. was used for spin coating. After coating, the coated film 2 was baked at predetermined temperatures of 70° C., 250° C. and 350° C., respectively for one minute.

The silicon substrate 1 formed with the porous silica film 2 in the manner described above was placed on a susceptor 10 of an ultraviolet (UV) processing apparatus, and heated to 350° C., and ultraviolet rays 3 were irradiated down to the porous silica film 2. It was confirmed that ultraviolet ray irradiation was able to increase a mechanical strength of the porous silica film by 1 GPa or more. The UV processing conditions were selected so as to satisfy the mechanical strength required for interlayer insulating films for multi-layer wirings.

As shown in FIG. 1B, the UV processing conditions were:
Substrate temperature: 350° C.
UV ray wavelength: 200 nm to 300 nm
Irradiation energy: 220 mW/cm$^2$
Irradiation time: 600 sec
Atmosphere: He
Pressure: 1.2 torr After the UV processing, Young's modulus, hardness and a relative dielectric constant were measured. The Young's modulus and hardness were measured by a nano indentation method. The relative dielectric constant was measured with a mercury probe. The Young's modulus and hardness can be considered as the characteristics representing mechanical strength of a film. The relative dielectric constant is intrinsic characteristics of low-k dielectric having a low dielectric constant, and it is desired that the relative dielectric constant does not increase too much by UV processing.

FIG. 1C shows the measured Young's modulus, hardness and relative dielectric constant of the porous silica film, comparatively before and after UV processing.

The Young's modulus increased from 10 to 12 GPa and the hardness increased from 0.9 to 1.1. This increase is considered as an increase in the mechanical strength effective for preventing interlayer cracks. The relative dielectric constant increased from 2.2 to 2.3.

FIG. 1D is a schematic cross sectional view illustrating hydrogen plasma processing. A porous silica film 2 was formed on a silicon substrate 1 in the manner described above. The silicon substrate was placed on a susceptor 11 a hydrogen plasma system and heated to 400° C. Hydrogen plasma 4 was irradiated to the porous silica film 2. The coated film contacted plasma. In the plasma processing, a power was selected to such an extent that the low dielectric constant structure was not destroyed. With the hydrogen plasma processing, it was also confirmed that the mechanical strength of the porous silica film was able to be increased by 1 GPa or more. The hydrogen plasma processing conditions were selected so as to satisfy the mechanical strength required for interlayer insulating films for multi-layer wirings.

As shown in FIG. 1E, the hydrogen plasma processing conditions were:
Substrate temperature: 400° C.
$H_2$ flow rate: 4000 sccm
Pressure: 2.3 torr
Input power (13.56 MHz): 100 W (an effective value obtained by subtracting a reflected power from the input power)
Plasma process time: 80 sec It may be noted that the substrate is heated to a temperature at least equal to the highest one of the plurality of baking temperatures.

FIG. 1F shows the measured Young's modulus, hardness and relative dielectric constant of the porous silica film, comparatively before and after hydrogen plasma processing. The Young's modulus increased from 10 to 12 GPa and the hardness increased from 0.9 to 1.1. This increase is considered as an increase in the mechanical strength effective for preventing interlayer cracks. The relative dielectric constant increased from 2.2 to 2.3.

It can be seen that as the mechanical strength is increased by about the same degree by the UV processing and hydrogen plasma processing, the relative dielectric constant is also increased by about the same degree. Hydrogen plasma emits ultraviolet rays and has a function of ultraviolet ray irradiation. The effect by about the same degree suggests that the phenomena occurring during these processings are equal or similar. Ultraviolet rays correspond to a chemical reaction energy. Porous silica material contains substances capable of cross-linking such as Si—OH and Si—OC$_x$H$_y$. There is a large possibility that an increase in the mechanical strength of a film results from cross-linking reactions of film substances.

FIG. 1G shows reaction equations representative of possible cross-linking reactions. It is considered that the mechanical strength of a film is increased, as cross-linking reactions progress and curing progresses.

Assuming that this assumption is correct, materials capable of being cured by ultraviolet rays and hydrogen plasma may be organic SOG, CVD films and the like having a side chain structure of SiOH and SiOC$_x$H$_y$. The wavelength of ultraviolet rays is not limited to 200 nm to 300 nm. A process time is preferably 60 to 100 sec. It can be considered that cross-linking reactions can be enhanced by applying an energy corresponding to ultraviolet rays to a coated film. Similar effects may be expected not only by ultraviolet rays and hydrogen plasma, but also by plasma of different gases and by energy beams of other types such as an electron beam. An amount of an increase in the mechanical strength by processing can be selected in accordance with the intended application. It is also possible to obtain a larger or smaller increase in the mechanical strength.

Four kinds of structure of the interlayer insulating films and the copper wirings were designed in accordance with the above-described experimental results.

FIGS. 2A to 2E illustrate the structure of interlayer insulating films and copper wirings of the first kind. As shown in FIG. 2A, an isolation region 22 is formed in a silicon substrate 21, by shallow trench isolation (STI), and an n-type well NW and a p-type well PW are formed by ion implantation. The isolation region 22 includes a silicon oxide liner formed by thermal oxidation of the silicon substrate, a silicon nitride liner formed on the silicon oxide liner by CVD, and a silicon oxide film formed by high density plasma (HDP) CVD and buried in the remaining space of the trench.

The silicon substrate surfaces surrounded by the isolation region 22 are thermally oxidized to form a gate insulating film 23. Polysilicon is deposited on the gate insulating film 23, and patterned to form a gate electrode 24. Extension regions 25 are formed by ion implantation using the gate electrode 24 as a mask. An insulating film such as silicon oxide is deposited on the substrate, covering the gate electrode 24, and sidewall spacers 26 are formed on the sidewalls of the gate electrode by anisotropic etching. High concentration, deep source/drain regions 27 are formed by ion implantation using the sidewall spacers 26 as a mask. In this manner, an n-channel MOS transistor (NMOS) is formed in the p-type well PW and a p-channel MOS transistor (PMOS) is formed in the n-type well NW. NMOS and PMOS are processed separately by using photoresist masks, when necessary such as ion implantation processes or the like.

A lower interlayer insulating film 28 of phosphosilicate glass (PSG) or the like is formed on the silicon substrate, covering the transistors, and contact holes reaching the source/drain regions 27 are etched through the lower interlayer insulating film. Conductive plugs 29 are formed by burying tungsten in the contact holes, with a barrier metal layer such as Ti/TiN being interposed therebetween. These processes are well known, and may be replaced by other well-known processes or some processes may be added.

An etch stopper film ES1 of SiC is deposited to a thickness of about 50 nm by CVD on the lower interlayer insulating film 28, a porous silica film PS1 having a thickness of about 200 nm is formed on the etch stopper film, and a cap layer CL1 of SiC is deposited to a thickness of about 50 nm on the porous silica film. Trenches are etched through these three layers ES1, PS1, CL1, a copper wiring layer is buried in the trenches, and an unnecessary copper wiring layer on the cap layer CL1 is removed by chemical mechanical polishing (CMP) to form a first copper wiring CW1.

Figure 2B:
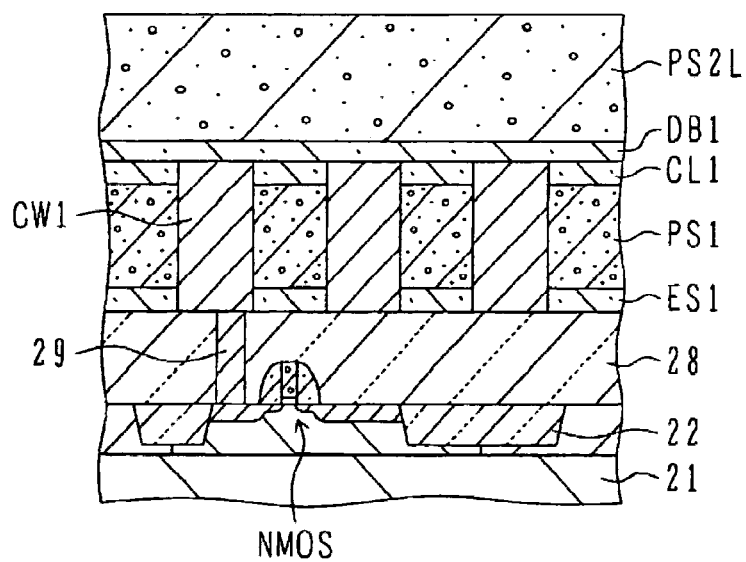

As shown in FIG. 2B, a copper diffusion preventive or diffusion barrier film DB1 for preventing copper diffusion is formed on the cap layer CL1, covering the first copper wiring layer CW1, the copper diffusion preventive film being made of SiC and having a thickness of about 50 nm. Porous silica material is coated on the copper diffusion preventive film DB1 and baked to form a porous silica film PS2L. The porous silica film PS2L surrounds later via conductors of damascene wiring.

Figure 2C:
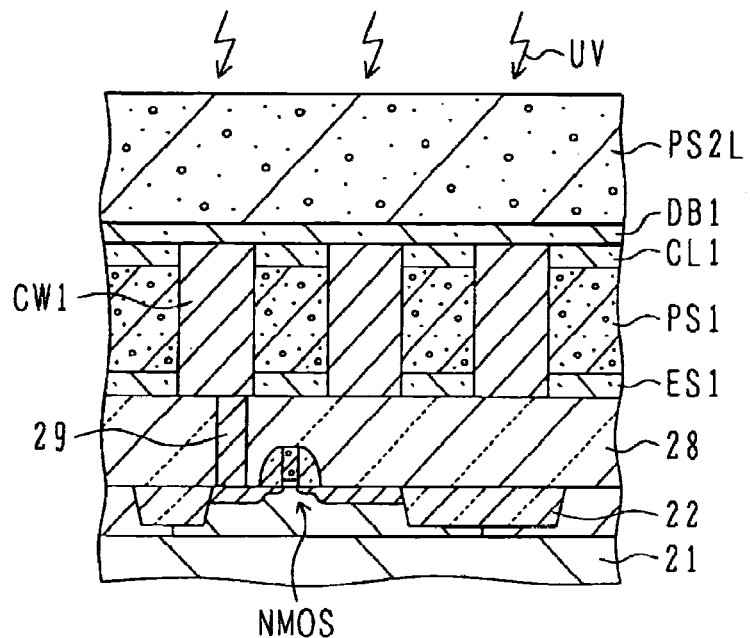

As shown in FIG. 2C, UV processing is performed by irradiating ultraviolet rays UV to the porous silica film PS2L. The UV processing is performed in the manner described with reference to FIGS. 1A to 1C. The mechanical strength of the porous silica film PS2L increases to have Young's modulus of about 12 GPa and hardness of about 1.1. The relative dielectric constant of the porous silica film PS2L increases from about 2.2 to about 2.3.

Figure 2D:
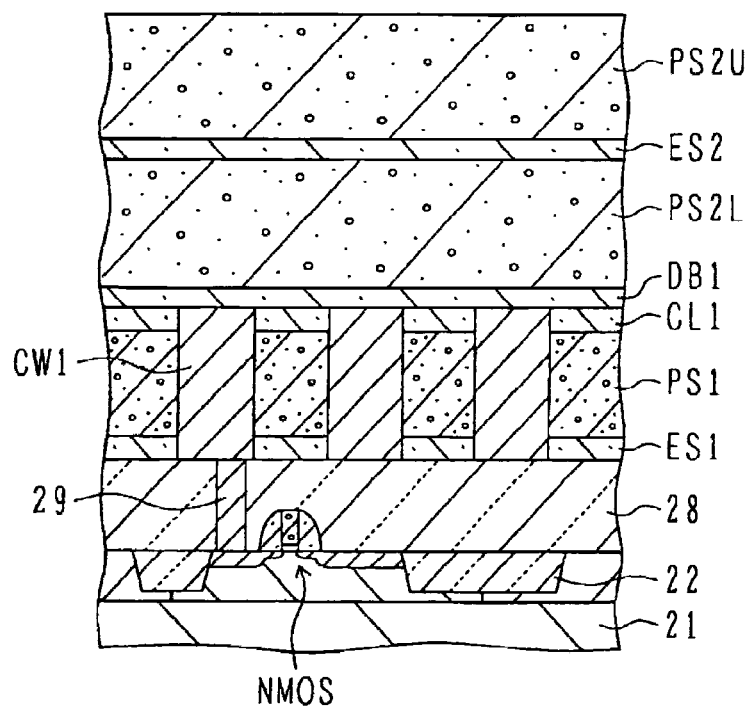

As shown in FIG. 2D, an etch stopper film ES2 of SiC is deposited to a thickness of about 50 nm by CVD on the processed porous silica film PS2L, and a porous silica film PS2U having a thickness of about 200 nm is formed on the etch stopper film ES2. This porous silica film PS2U surrounds later wiring patterns of the damascene wiring. Although the porous silica film is baked after coating to form porous silica, the ultraviolet ray processing is not performed to maintain the low dielectric constant.

Figure 2E:
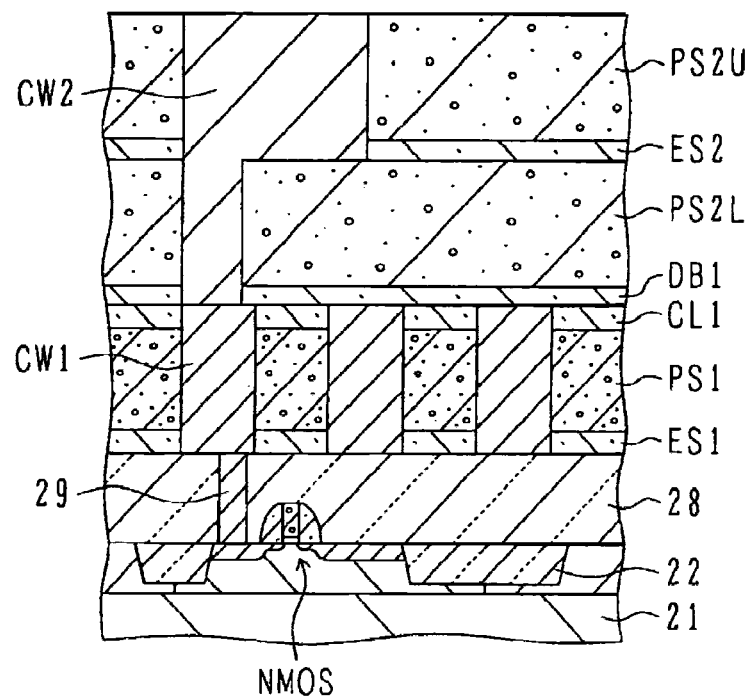

As shown in FIG. 2E, by using a mask having openings corresponding to contact areas of the first copper wiring CW1, via holes exposing the copper diffusion preventive film DB1 are etched through the porous silica film PS2U, etch stopper film ES2 and porous silica film PS2L. After a filler is buried in the via hole, by using a mask having openings corresponding to wiring patterns, wiring trenches are etched through the porous silica film PS2U. During this etching, the etching is stopped once at the surface of the etch stopper film ES2 and the filler in the via hole is removed. Thereafter, the SiC films DB1 and ES2 exposed on the bottoms of the via holes and trenches are etched to expose the connection areas of the first copper wiring CW1. Thereafter, a barrier metal layer and a copper seed layer are formed through sputtering, a copper layer is plated, and unnecessary portions of the metal layers on the interlayer insulating film are removed by CMP. In this manner, a second copper wiring layer CW2 buried in the interlayer insulating film is formed. By using the above-described processes, a sample of the first kind for the structure of interlayer insulating films and copper wirings was formed.

Figure 3A:
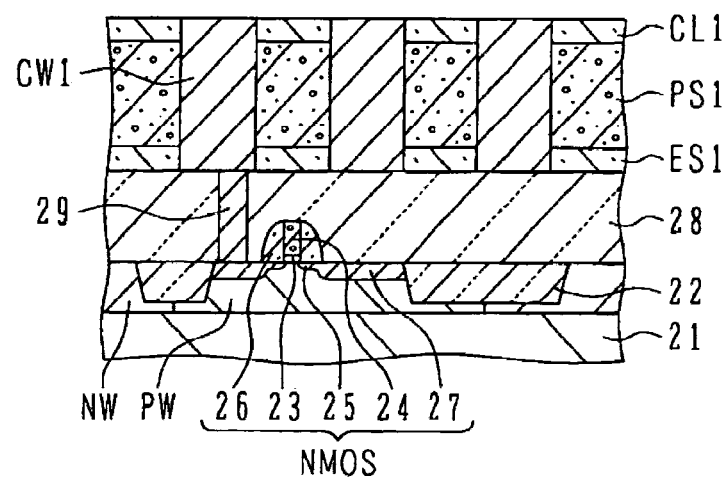
FIGS. 3A to 3C are schematic cross sectional views illustrating the processes of forming interlayer insulating films and copper wirings of a second kind.
Figure 3B:
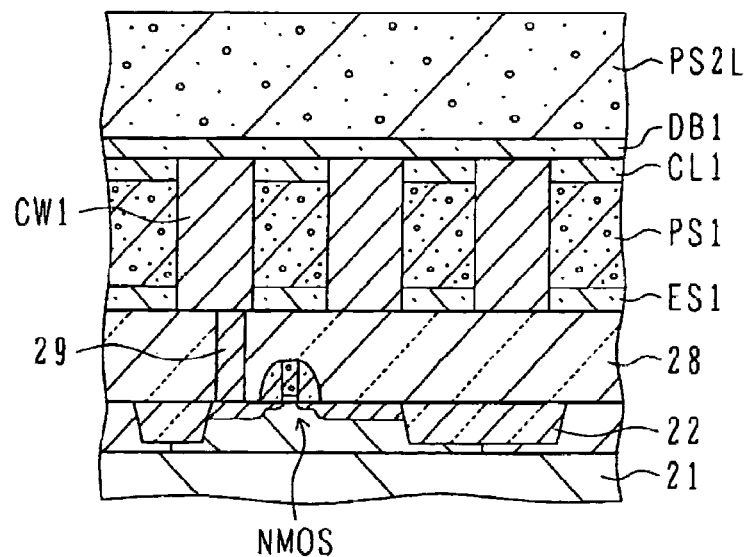
Figure 3C:
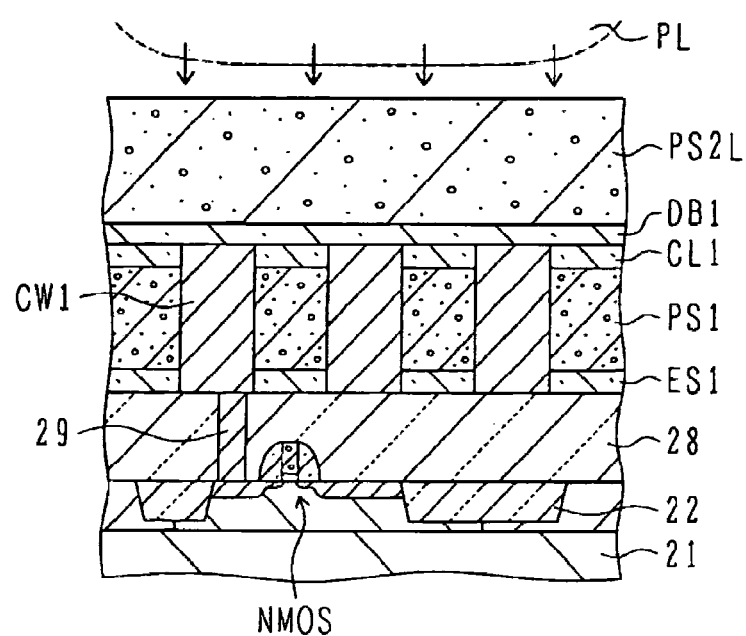

FIGS. 3A to 3C illustrate the structure of interlayer insulating films and copper wirings of the second kind.

Similar to FIGS. 2A and 2B, FIGS. 3A and 3B illustrate processes of: forming semiconductor devices NMOS and PMOS in a silicon substrate 21; forming a lower interlayer insulating film 28 on the silicon substrate; burying a conductive plug 29 in the lower interlayer insulating film; forming an interlayer insulating film PS1 of porous silica sandwiched between SiC films ES1 and CL1, on the lower interlayer insulating film and conductive plug; burying a first copper wiring CW1 in the interlayer insulating film; and forming a copper diffusion preventive film DB1 and a porous silica film PS2L covering the first copper wiring.

As shown in FIG. 3C, the silicon substrate is transported into a plasma system and the hydrogen plasma processing described with reference to FIGS. 1D to 1F is performed. Hydrogen plasma PL emits ultraviolet rays. With the hydrogen plasma processing, the mechanical strength of the porous silica film PS2L increases to have Young's modulus of about 12 GPa and hardness of about 1.1. The relative dielectric constant of the porous silica film increases to about 2.3. The state after the hydrogen plasma processing is considered similar to the state after the UV processing shown in FIG. 2C.

Thereafter, processes shown in FIGS. 2D and 2E are performed to form a second copper wiring CW2 of the damascene wiring. By using the above-described processes, a sample of the second kind for the structure of interlayer insulating films and copper wirings was formed.

Figure 4A:
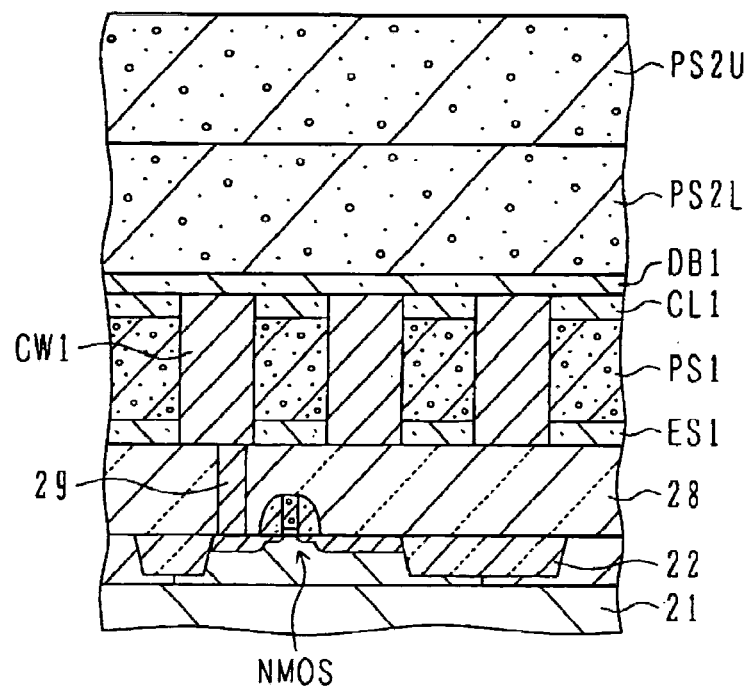
FIGS. 4A and 4B are schematic cross sectional views illustrating the processes of forming interlayer insulating films and copper wirings of third and fourth kinds.
Figure 4B:
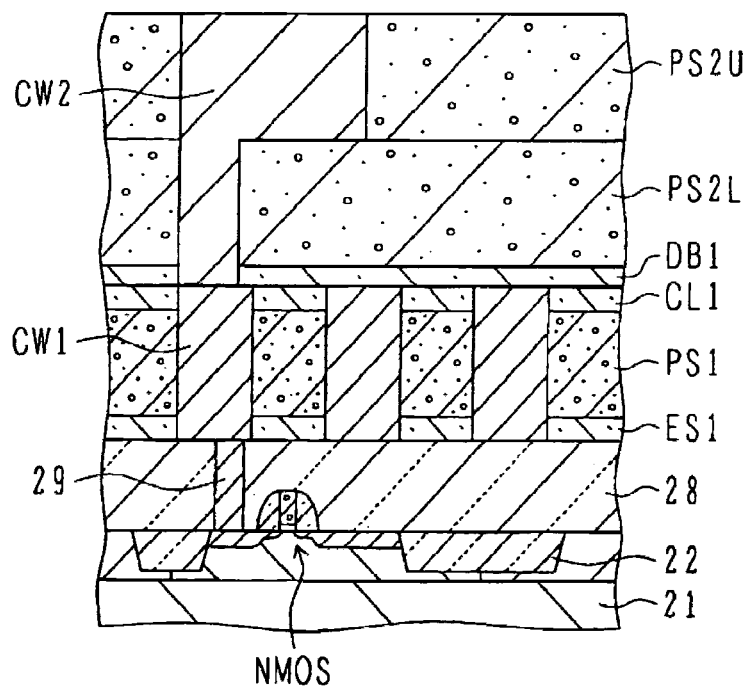

FIGS. 4A and 4B illustrate a method of forming a structure of interlayer insulating films and copper wirings of the third and fourth kinds. The porous silica film PS2L having an increased mechanical strength and other components are formed by the processes shown in FIGS. 2A to 2C or FIGS. 3A to 3C.

As shown in FIG. 4A, a porous silica film PS2U having a thickness of about 200 nm is formed on the porous silica film PS2L. This porous silica film PS2U surrounds later wiring patterns of a damascene wiring. Although the porous silica film is baked after coating to form porous silica, the ultraviolet ray processing and hydrogen plasma processing are not performed to maintain the low dielectric constant.

As shown in FIG. 4B, by using a mask having openings corresponding to contact areas of the first copper wiring CW1, via holes exposing the copper diffusion preventive film DB1 are etched through the porous silica film PS2U and porous silica film PS2L. After filler is buried in the via holes, by using a mask having openings corresponding to wiring patterns, wiring trenches are control-etched through the porous silica film PS2U. The filler in the via hole is removed, and thereafter, the SiC film DB1 exposed on the bottom of the via holes is etched to expose the connection areas of the first copper wiring CW1. Thereafter, a barrier metal layer and a copper seed layer are formed through sputtering, a copper layer is plated, and unnecessary portions of the metal layers on the interlayer insulating film are removed by CMP. The structure of interlayer insulating films and copper wirings of the third and fourth kinds corresponds to the structure of interlayer insulating films and copper wirings of the first and second kinds, with the etch stopper film ES2 being omitted. Samples of the third and fourth kinds for the structure of interlayer insulating films and copper wirings were also formed.

Cracks in the interlayer insulating films were not observed during the manufacture processes for four kinds of the samples.

Figure 5:
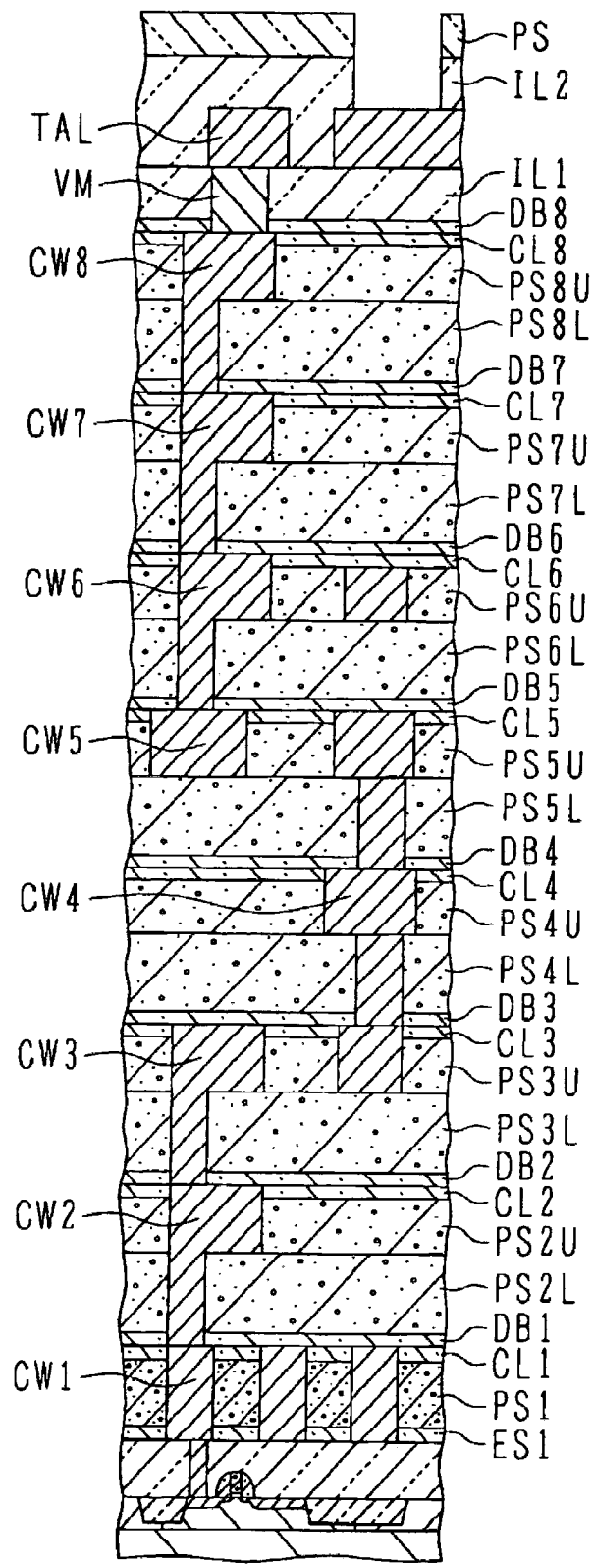
FIG. 5 is a schematic cross sectional view showing the structure of a semiconductor device having multi-layer wirings according to an embodiment.

FIG. 5 is a cross sectional view of a semiconductor device having a multi-wiring structure including eight copper wirings and the uppermost aluminum wiring, according to an embodiment. The structure under the porous silica film PS2U is similar to the structure of interlayer insulating films and copper wirings of the third and fourth kinds. After a cap layer CL2 of SiC having a thickness of 50 nm is formed on the porous silica film PS2U, a second copper wiring CW2 is formed. Six interlayer insulating films are laminated thereon. Each interlayer insulating film includes a copper diffusion preventive film DB(i−1), a low-level porous silica film PSiL, an high-level porous silica film PSiU and an SiC cap layer CLi (where i is a numerical number of each copper wiring layer, and i=3 to 8). The low-level porous silica film PSiL is processed by ultraviolet rays or hydrogen plasma to increase a mechanical strength. A copper wiring CWi of a damascene structure is buried in each interlayer insulating film. Eight layers of the copper wiring are laminated in this way.

Similar to the samples of the first and second kinds, the structure may be formed which has an SiC etch stopper film ESi inserted between the high-level porous silica film PSiU and low-level porous silica film PSiL, as shown in FIG. 2E.

A copper diffusion preventive film DB8 is formed on the cap layer CL8, covering the copper wiring CW8, and a silicon oxide film IL1 is formed on the copper diffusion preventive film DB8. A via hole is formed through the silicon oxide film IL1, and a tungsten via VM is buried in the via hole. An aluminum wiring TAL is formed on the silicon oxide film IL1, being connected to the tungsten via VM. A silicon oxide film IL2 is formed covering the aluminum wiring TAL, and an opening is formed in a region corresponding to a pad portion. A passivation film PS is formed and the pad portion is opened. In this manner, the semiconductor device having multi-layer wirings is formed.

Samples of the structure of interlayer insulating and copper wirings films of four kinds were actually formed. Four kinds include those in which the low-level porous silica film PSiL processed by ultraviolet rays or hydrogen plasma, and the SiC etch stopper film Esi inserted or not inserted between the high-level porous silica film PSiU and low-level porous silica film PSiL. The four kinds of samples were sealed in packages and a wire bonding test was conducted. Destruction and peel-off to be caused by cracks in the interlayer insulating films were not observed, and it was confirmed that the mechanical strength of the interlayer insulating films were improved as expected.

The interlayer insulating film in which a wiring pattern is buried is made of dielectric which has a low dielectric constant although the mechanical strength is weak. The mechanical strength of the interlayer insulating film in which a via conductor is buried is improved, so that the interlayer insulating film can be prevented from being destroyed. Although the dielectric constant of the interlayer insulating film in which a via conductor is buried increases, an increase in parasitic capacitance of the whole wirings can be suppressed because the via conductor has a low in-plane density and a pitch between via conductors can be secured.

The present invention has been described in connection with the preferred embodiments. The invention is not limited only to the above embodiments. For example, the substrate temperature during processing is not limited to 350° C. and 400° C. However, it may be preferable to set the substrate temperature to a temperature equal to or higher than the highest baking temperature among the plurality of baking temperatures. It will be apparent to those skilled in the art that other various modifications, improvements, combinations, and the like can be made.

I claim:

1. A semiconductor device manufacture method comprising the steps of:
   (a) forming a first insulating film of first porous silicon oxide, having a mechanical strength of a first value above a semiconductor substrate using spin-coating;
   (b) processing said first insulating film to increase the mechanical strength of the first insulating film from the first value to a second value;
   (c) after the step (b), forming a second insulating film of second porous silicon oxide, having a mechanical strength of a third value lower than the second value above said first insulating film using spin-coating; and
   (d) forming a buried wiring including a wiring pattern in said second insulating film and a via conductor in said first insulating film.

2. The method of manufacturing a semiconductor device according to claim 1, wherein said step (b) induces cross-linking reactions in said first insulating film.

3. The method of manufacturing a semiconductor device according to claim 1, wherein said step (b) includes irradiating ultraviolet rays.

4. The method of manufacturing a semiconductor device according to claim 3, wherein said ultraviolet rays contain a component having a wavelength in a range of 200 nm to 300 nm.

5. The method of manufacturing a semiconductor device according to claim 1, wherein said step (b) includes processing by hydrogen plasma.

6. The method of manufacturing a semiconductor device according to claim 1, wherein said steps (a) and (c) coat a same starting material for a porous insulating material.

7. The method of manufacturing a semiconductor device according to claim 1, wherein said steps (a) and (c) include a step of baking the coated film at a plurality of gradually rising baking temperatures.

8. The method of manufacturing a semiconductor device according to claim 7, wherein said step (b) is performed by heating the semiconductor substrate at a temperature equal to or higher than a highest one of said plurality of baking temperatures.

9. The method of manufacturing a semiconductor device according to claim 1, further comprising the step of:
(e) forming a third insulating film formed of a material different from the first and second insulating films and functioning as an etch stopper on said first insulating film, between said steps (b) and (c),
wherein said step (d) includes the step of forming a via hole through said second insulating film to said first insulating film and the step of forming a wiring pattern trench at least in said second insulating film by using said third insulating film as the etch stopper.

10. The method of manufacturing a semiconductor device according to claim 1, further comprising the step of:
(f) after said step (d), forming an insulating copper diffusion preventive film on said high-level insulating film, said insulating copper diffusion preventive film covering said buried wiring.

* * * * *